(12) United States Patent
Wang et al.

(10) Patent No.: US 12,310,107 B2
(45) Date of Patent: May 20, 2025

(54) ARRAY SUBSTRATE AND MANUFACTURING METHOD THEREOF, DISPLAY DEVICE, AND MASK

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Xiaoyuan Wang, Beijing (CN); Yan Fang, Beijing (CN); Wu Wang, Beijing (CN); Yajie Bai, Beijing (CN); Ruilin Bi, Beijing (CN); Shengxue Wu, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 26 days.

(21) Appl. No.: 16/966,215

(22) PCT Filed: Dec. 13, 2019

(86) PCT No.: PCT/CN2019/125128
§ 371 (c)(1),
(2) Date: Jul. 30, 2020

(87) PCT Pub. No.: WO2020/173178
PCT Pub. Date: Sep. 3, 2020

(65) Prior Publication Data
US 2021/0233939 A1 Jul. 29, 2021

(30) Foreign Application Priority Data
Feb. 28, 2019 (CN) .......................... 201910152883.0

(51) Int. Cl.
H10D 86/60 (2025.01)
G02F 1/1362 (2006.01)
(Continued)

(52) U.S. Cl.
CPC ......... H10D 86/60 (2025.01); H10D 86/0231 (2025.01); H10D 86/443 (2025.01);
(Continued)

(58) Field of Classification Search
CPC ............ H01L 51/0097; H01L 27/1244; H01L 27/124; H01L 27/1248; H01L 27/1288;
(Continued)

(56) References Cited

U.S. PATENT DOCUMENTS 7,952,099 B2    5/2011  Deng et al.
9,287,342 B2 *  3/2016  Kwon .................. H10K 77/111
(Continued)

FOREIGN PATENT DOCUMENTS

CN    101060123 A    10/2007
CN    101894756 A    11/2010
(Continued)

OTHER PUBLICATIONS

First Chinese Office Action from Chinese Patent Application No. 201910152883.0 dated on Jun. 2, 2020.

Primary Examiner — Samuel A Gebremariam
Assistant Examiner — Jonas T Beardsley
(74) Attorney, Agent, or Firm — Dilworth & Barrese, LLP.; Michael J. Musella, Esq.

(57) ABSTRACT

An array substrate, a manufacturing method thereof, a display device, and a mask are provided. The array substrate includes a base substrate; a first conductive layer located on the base substrate; and an organic layer located on a side of the first conductive layer away from the base substrate, the peripheral region includes at least one bonding region, in
(Continued)

each bonding region, the first conductive layer includes multiple wires arranged at intervals, the organic layer includes a first opening exposing the wires, the first opening includes an edge intersected with an extension direction of each wires, and the organic layer further includes a zigzag-shaped groove connected with the edge; in a direction perpendicular to the base substrate, a depth of the zigzag-shaped groove is less than a thickness of the organic layer, an orthographic projection of the zigzag-shaped groove on a plane parallel with the base substrate is zigzag-shaped.

16 Claims, 8 Drawing Sheets

(51) Int. Cl.
*H10D 86/01* (2025.01)
*H10D 86/40* (2025.01)

(52) U.S. Cl.
CPC ..... *H10D 86/451* (2025.01); *G02F 1/136204* (2013.01); *G02F 1/136222* (2021.01)

(58) Field of Classification Search
CPC ........... G02F 1/136204; G02F 1/13458; G02F 1/136286; G02F 1/133345; G02F 1/13338; G02F 1/134309; H10D 86/60; H10D 86/451; H10D 86/441; H10D 86/0231
See application file for complete search history.

(56) References Cited

U.S. PATENT DOCUMENTS

| | | | |
|---|---|---|---|
| 9,535,299 B2 | 1/2017 | Du | |
| 10,573,833 B2 | 2/2020 | Chen et al. | |
| 2006/0267016 A1* | 11/2006 | Ahn | G02F 1/1339 438/149 |
| 2009/0109364 A1* | 4/2009 | Yang | G03F 7/0005 355/71 |
| 2015/0355516 A1* | 12/2015 | Imai | G02F 1/13439 349/123 |
| 2018/0046045 A1 | 2/2018 | Chen et al. | |
| 2018/0314017 A1 | 11/2018 | Nuttall et al. | |
| 2018/0314122 A1* | 11/2018 | Saitoh | G06F 3/0412 |
| 2019/0072851 A1* | 3/2019 | Tanigaki | G03F 7/0385 |
| 2019/0302551 A1 | 10/2019 | Cao | |
| 2020/0187359 A1 | 6/2020 | Zheng | |
| 2020/0212151 A1* | 7/2020 | Zhang | G09F 9/301 |
| 2020/0379307 A1 | 12/2020 | Zhang et al. | |

FOREIGN PATENT DOCUMENTS

| | | |
|---|---|---|
| CN | 104062786 A | 9/2014 |
| CN | 104714363 A | 6/2015 |
| CN | 105137709 A | 12/2015 |
| CN | 105514125 A | 4/2016 |
| CN | 106842647 A | 6/2017 |
| CN | 107238962 A | 10/2017 |
| CN | 107247386 A | 10/2017 |
| CN | 107706156 A | 2/2018 |
| CN | 108231692 A | 6/2018 |
| CN | 108389868 A | 8/2018 |
| CN | 207780747 U | 8/2018 |
| CN | 108538856 A | 9/2018 |
| CN | 109003543 A | 12/2018 |
| CN | 109239994 A | 1/2019 |
| CN | 109283758 A | 1/2019 |
| CN | 109884830 A | 6/2019 |
| WO | 2016083934 A1 | 6/2016 |

* cited by examiner

ARRAY SUBSTRATE AND MANUFACTURING METHOD THEREOF, DISPLAY DEVICE, AND MASK

The application claims priority of the Chinese patent application No. 201910152883.0, filed on Feb. 28, 2019, the entire disclosure of which is incorporated herein by reference as part of the present application.

TECHNICAL FIELD

Embodiments of the present disclosure relate to an array substrate, a manufacturing method thereof, a display device, and a mask.

BACKGROUND

With the continuous development of display technology, Liquid Crystal Display (LCD) device has become the mainstream display device in the market. Color Filter On Array (COA) technology is a technology that integrates a color filter with an array substrate. By applying a color filter material on a completed array substrate to form a color filter layer, an aperture ratio of the liquid crystal display device can be improved. Moreover, the COA technology can reduce the difficulty in the process of aligning an array substrate with a color filter substrate, thereby improving the product yield and reducing the production cost.

SUMMARY

Embodiments of the present disclosure provide an array substrate, a manufacturing method thereof, a display device, and a mask. The array substrate includes: a base substrate including a display region and a peripheral region located at a periphery of the display region; a first conductive layer located on the base substrate; and an organic layer located at a side of the first conductive layer away from the base substrate. The peripheral region includes at least one bonding region, and in each of the at least one bonding region, the first conductive layer includes a plurality of wires arranged at intervals, and the organic layer includes a first opening exposing the plurality of wires; the first opening includes an edge that is intersected with an extension direction of each of the plurality of wires; the organic layer further includes a zigzag-shaped groove connected with the edge; in a direction perpendicular to the base substrate, a depth of the zigzag-shaped groove is smaller than a thickness of the organic layer; and an orthographic projection of the zigzag-shaped groove on a plane parallel with the base substrate is zigzag-shaped. In this way, by providing the zigzag-shaped groove in the array substrate, a slope angle at an edge of the first opening is reduced, and a residue of the photoresist for patterning the subsequent conductive layer is avoided to be formed at the edge of the first opening, thereby avoiding a short circuit in the bonding region.

At least one embodiment of the present disclosure provides an array substrate, including: a base substrate including a display region and a peripheral region located at a periphery of the display region; a first conductive layer located on the base substrate; and an organic layer located at a side of the first conductive layer away from the base substrate. The peripheral region includes at least one bonding region, and in each of the at least one bonding region, the first conductive layer includes a plurality of wires arranged at intervals, and the organic layer includes a first opening exposing the plurality of wires; the first opening includes an edge that is intersected with an extension direction of each of the plurality of wires; the organic layer further includes a zigzag-shaped groove connected with the edge; in a direction perpendicular to the base substrate, a depth of the zigzag-shaped groove is smaller than a thickness of the organic layer; and an orthographic projection of the zigzag-shaped groove on a plane parallel with the base substrate is zigzag-shaped.

For example, in the array substrate provided by an embodiment of the present disclosure, the zigzag-shaped groove includes a plurality of zigzag portions arranged along the edge, and a distance between respective parts of any two adjacent zigzag portions at a side close to the edge is smaller than a resolution of an exposure machine.

For example, the array substrate provided by an embodiment of the present disclosure further includes: an insulation layer located between the first conductive layer and the organic layer, the insulation layer includes a second opening, and both the second opening and the first opening expose the plurality of wires.

For example, the array substrate provided by an embodiment of the present disclosure further includes: a second conductive layer located at a side of the organic layer away from the first conductive layer; in each of the at least one bonding region, the second conductive layer includes a plurality of electrode strips arranged at intervals, and the plurality of electrode strips are electrically connected with the plurality of wires, respectively, through both the second opening and the first opening.

For example, in the array substrate provided by an embodiment of the present disclosure, the plurality of electrode strips cover at least part of the zigzag-shaped groove, and extend beyond an end of the zigzag-shaped groove which is away from the first opening in the extension direction of the wire.

For example, in the array substrate provided by an embodiment of the present disclosure, in the extension direction of the wire, a length of each of the plurality of electrode strips extending beyond the end of the zigzag-shaped groove which is away from the first opening is greater than 10 microns.

For example, in the array substrate provided by an embodiment of the present disclosure, the edge is perpendicular to the extension direction of the wire.

For example, in the array substrate provided by an embodiment of the present disclosure, the zigzag-shaped groove includes a plurality of triangular grooves arranged side by side in sequence, and each of the plurality of triangular grooves includes a bottom side and a vertex angle opposite to the bottom side, the bottom side is overlapped with the edge, and the vertex angle is located at a side of the bottom side away from the first opening.

For example, in the array substrate provided by an embodiment of the present disclosure, a height of the triangular groove in the extension direction of the wire is greater than or equal to 50 microns.

For example, in the array substrate provided by an embodiment of the present disclosure, a width of the wire is D1, a distance between two adjacent wires is D2, and a length of the bottom side is (D1+D2)/2.

For example, in the array substrate provided by an embodiment of the present disclosure, the organic layer includes a triangular region between two adjacent triangular grooves, and the triangular region is provided between two adjacent wires.

For example, in the array substrate provided by an embodiment of the present disclosure, in a direction from the bottom side of the triangular groove to the vertex angle of the triangular groove, a depth of each of the plurality of triangular grooves gradually decreases in a direction perpendicular to the base substrate.

For example, in the array substrate provided by an embodiment of the present disclosure, the zigzag-shaped groove includes a plurality of trapezoidal grooves arranged side by side in sequence, and each of the plurality of trapezoidal grooves includes a long base and a short base opposite to the long base, the long base is overlapped with the edge, and the short base is located at a side of the long base away from the first opening.

For example, in the array substrate provided by an embodiment of the present disclosure, a length of the long base is greater than a resolution of an exposure machine, and a length of the short base is less than the resolution of the exposure machine.

For example, in the array substrate provided by an embodiment of the present disclosure, the zigzag-shaped groove includes a plurality of rectangular grooves arranged at intervals, and a side of each of the plurality of rectangular grooves is overlapped with the edge, a width of the interval between adjacent rectangular grooves in the direction perpendicular to the extension direction of the wire is smaller than a resolution of an exposure machine.

For example, in the array substrate provided by an embodiment of the present disclosure, the insulation layer includes a gate insulation layer and a passivation layer, and the organic layer includes a photoresist.

For example, in the array substrate provided by an embodiment of the present disclosure, a material of the first conductive layer includes a metal, and a material of the second conductive layer includes a transparent metal oxide.

At least one embodiment of the present disclosure further provides a display device including the array substrate described in any of the above.

At least one embodiment of the present disclosure further provides a manufacturing method of an array substrate, including: forming a first conductive layer on a base substrate; forming an organic material layer at a side of the first conductive layer away from the base substrate; and patterning the organic material layer to form an organic layer. The base substrate includes a display region and a peripheral region located at a periphery of the display region, the peripheral region includes at least one bonding region, and in each of the at least one bonding region, the first conductive layer includes a plurality of wires arranged at intervals, the organic layer includes a first opening, the first opening exposes the plurality of wires, the first opening includes an edge that is intersected with an extension direction of each of the plurality of the wires, and the organic layer further includes a zigzag-shaped groove connected with the edge; in a direction perpendicular to the base substrate, a depth of the zigzag-shaped groove is smaller than a thickness of the organic layer, and an orthographic projection of the zigzag-shaped groove on a plane parallel with the base substrate is zigzag-shaped.

For example, the manufacturing method of the array substrate provided by an embodiment of the present disclosure further includes: before forming the organic material layer, forming an insulation material layer at a side of the first conductive layer away from the base substrate; patterning the organic material layer to form an organic layer includes: patterning the insulation material layer and the organic material layer by using a single masking process to form an insulation layer and the organic layer; the insulation layer includes a second opening, both the first opening and the second opening expose the plurality of wires.

For example, the manufacturing method of the array substrate provided by an embodiment of the present disclosure further includes: forming a second conductive layer at a side of the organic layer away from the first conductive layer; in each of the at least one bonding region, the second conductive layer includes a plurality of electrode strips arranged at intervals, and the plurality of electrode strips are electrically connected with the plurality of wires, respectively, through both the second opening and the first opening.

For example, in the manufacturing method of the array substrate provided by an embodiment of the present disclosure, patterning the insulation material layer and the organic material layer by using a single masking process to form an insulation layer and the organic layer includes: exposing and developing the organic material layer by using a mask to form, in the organic layer, the first opening and the zigzag-shaped groove located in the bonding region; and etching the insulation material layer by using the organic layer including the first opening as a mask to form, in the insulation layer, the second opening located in the bonding region.

At least one embodiment of the present disclosure further provides a mask for manufacturing the array substrate described in any one of the above, the mask includes a pattern portion, the pattern portion includes a portion corresponding to the first opening and a portion corresponding to the zigzag-shaped groove.

For example, in the mask provided by an embodiment of the present disclosure, a material of the organic layer includes a negative photoresist, and the pattern portion is an opaque portion.

For example, in the mask provided by an embodiment of the present disclosure, a material of the organic layer includes a positive photoresist, and the pattern portion is a light-transmission portion.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

At present, by forming a color filter on an array substrate, the display device adopting the COA technology can increase the pixel aperture ratio on the one hand, and simplify the process steps and reduce the process difficulty on the other hand. In particular, when applied to curved products, the display device adopting the COA technology can also avoid light leakage defect and has better product competitiveness. Generally, the display device adopting the COA technology needs to use an organic layer (ORG) to flatten a step difference of the film layer below the organic layer, thereby improving the flatness of the array substrate and reducing the load of the product.

Figure 1:
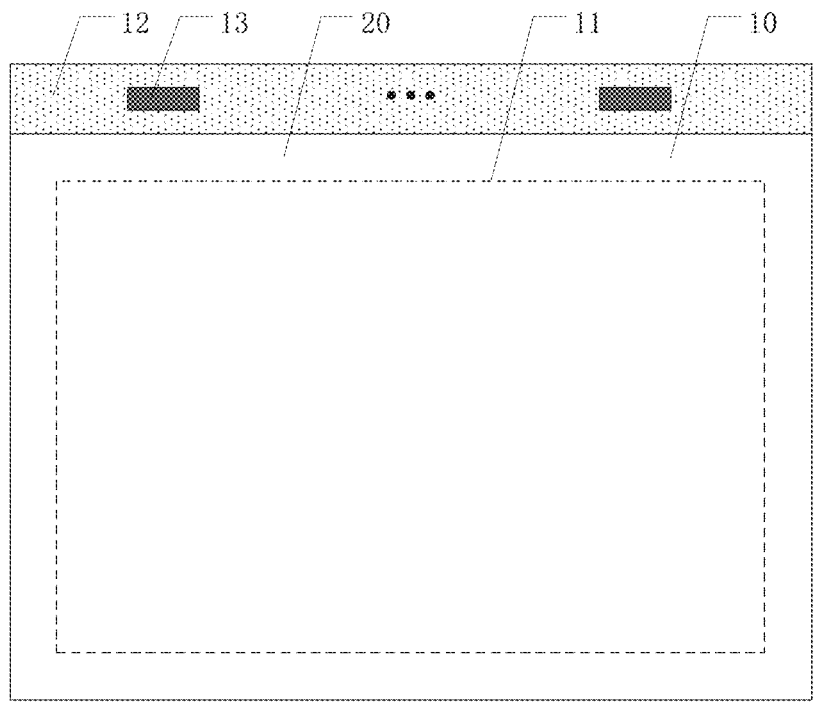
FIG. 1 is a schematic plan view of an array substrate.

FIG. 1 is a schematic plan view of an array substrate. As illustrated in FIG. 1, the array substrate 10 includes a display region 11 and a peripheral region 12 located at a periphery of the display region 11; the display region 11 is provided with a color filter layer 20. In FIG. 1, the color filter layer 20 is also provided in a part of the peripheral region 12 surrounding the display region 11. As illustrated in FIG. 1, the peripheral region 12 includes at least one bonding region 13. The bonding region 13 is configured to extend various signal lines in the display region 11 to be connected with an external driving circuit.

In a display device adopting COA technology, an insulation layer is provided on a wire of an array substrate, an organic layer is provided on the insulation layer, and a conductive layer is provided on the organic layer. Due to a large thickness (generally greater than 2 microns) of the organic layer, if a via hole is to be formed in the organic layer to achieve an electrical connection between the conductive layer and the wire, the via hole in the organic layer needs to be made very large (about 20 microns in diameter) but a width of the wire usually is less than 20 microns, which makes it impossible to effectively form the via hole. On the other hand, if the via hole in the organic layer is deep, due to a soft material of the organic layer, problems such as a deformation of the via hole of the organic layer are likely to be occurred in a subsequent bonding process. Thus, the electrical connection between the conductive layer and the wire cannot be achieved by forming a via hole. Therefore, when fabricating an array substrate adopting COA technology, the following two methods are generally used to achieve an electrical connection between the conductive layer and the wire.

The First Method

Figure 2A:
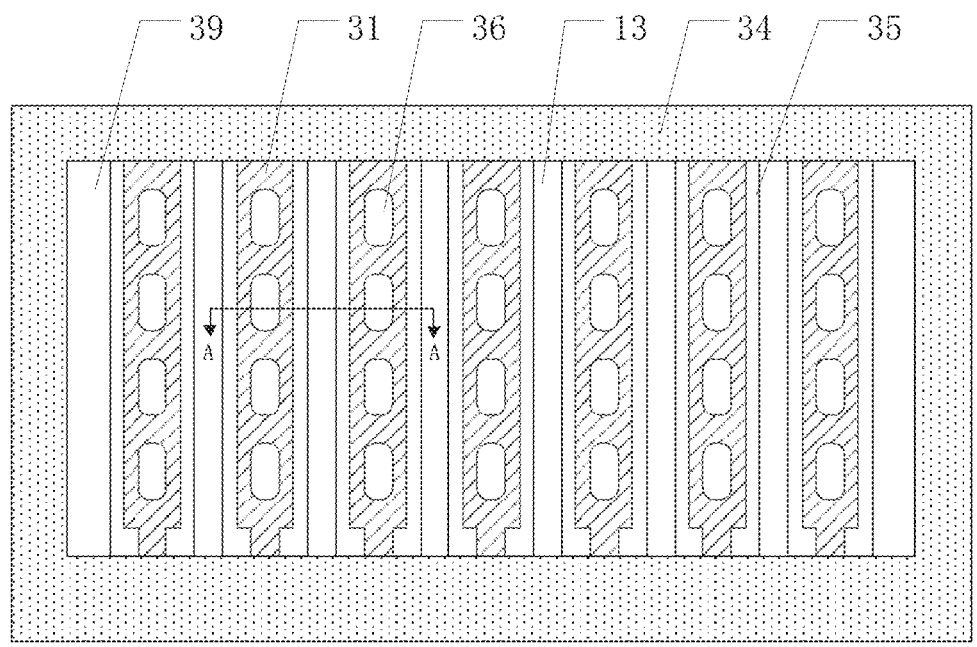
FIG. 2A is a schematic plan view of a bonding region of an array substrate.
Figure 2B:
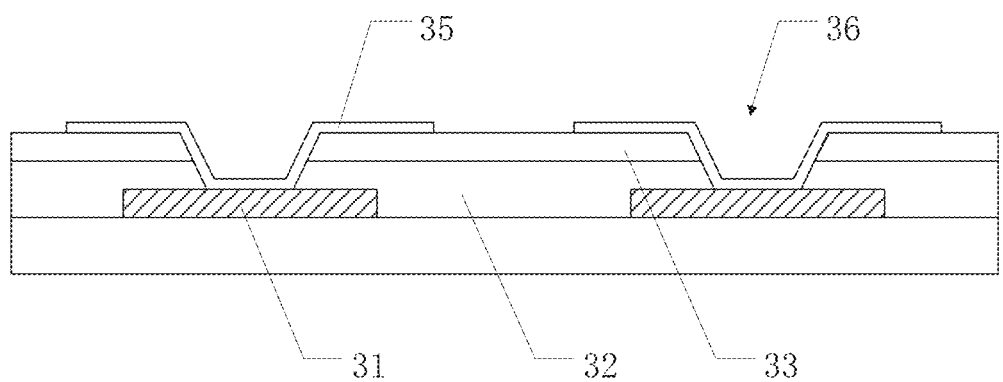
FIG. 2B is a schematic cross-sectional view of the bonding region illustrated in FIG. 2A taken along line AA.

FIG. 2A is a schematic plan view of a bonding region of an array substrate; FIG. 2B is a schematic cross-sectional view of the bonding region illustrated in FIG. 2A taken along line AA. As illustrated in FIG. 2A and FIG. 2B, the bonding region 13 includes a wire 31, a gate insulation layer 32, a passivation layer 33, an organic layer 34, and a conductive layer 35. The wire 31 may be a gate metal layer, and the conductive layer 35 may be a layer made of indium tin oxide (ITO). As illustrated in FIG. 2A and FIG. 2B, firstly, patterning the organic layer 35 by using a mask to remove a part of the organic layer 35 located in an entirety of the bonding region 13 to form an opening 39 having the same shape as the bonding region 13; and then patterning the gate insulation layer 32 and the passivation layer 33 by using another mask to form a via hole 36 in the gate insulation layer 32 and the passivation layer 33, so that the conductive layer 35 can be connected with the wire 31 through the via hole 36 in the gate insulation layer 32 and the passivation layer 33. In this way, by connecting the conductive layer 35 with an external circuit, the external circuit can write a driving signal to the wire 31, and hence drive a pixel unit in the display region to perform displaying. However, the above process requires an additional masking process, which leads to increased cost and affects productivity. In addition, using two masks to pattern the organic layer and the passivation layer may easily cause defects such as undercut of a via hole in the display region, thereby affecting the product yield.

The Second Method

Figure 3A:
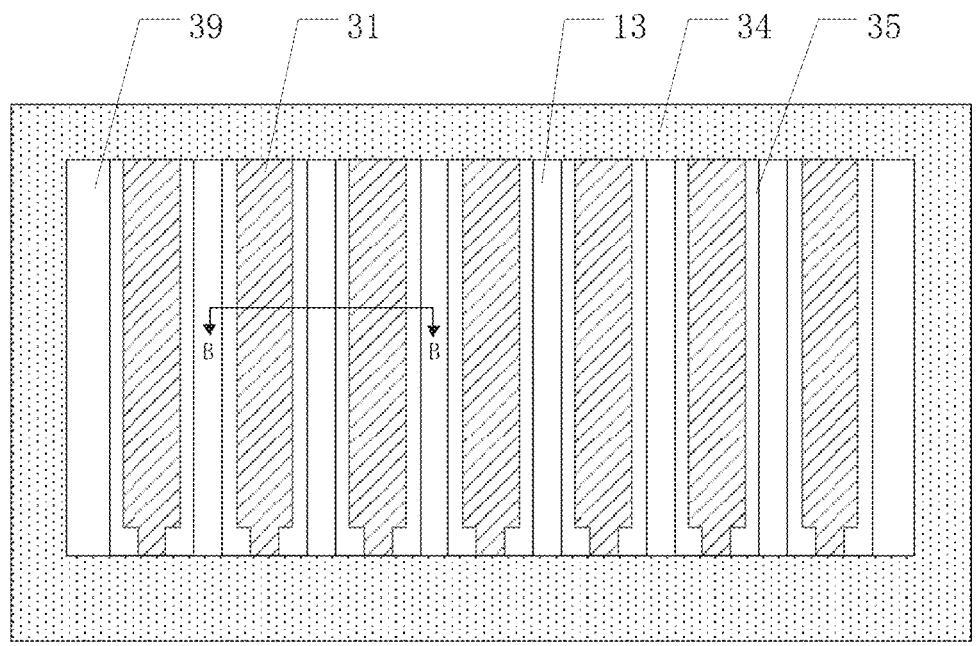
FIG. 3A is a schematic plan view of a bonding region of another array substrate.
Figure 3B:
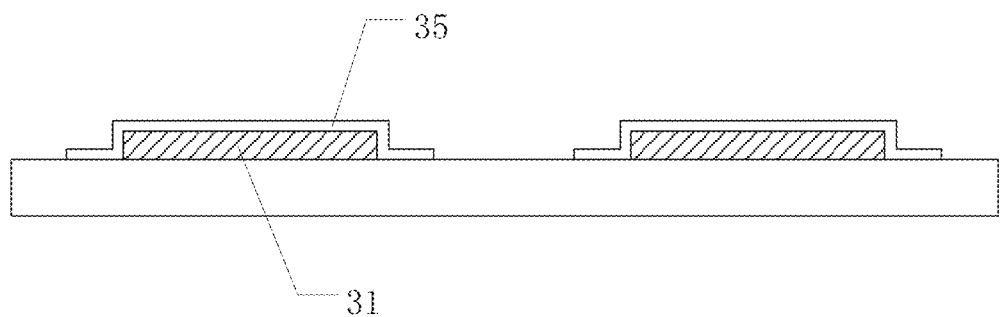
FIG. 3B is a schematic cross-sectional view of the bonding region illustrated in FIG. 3A taken along line BB.

FIG. 3A is a schematic plan view of another bonding region of an array substrate; FIG. 3B is a schematic cross-sectional view of the bonding region illustrated in FIG. 3A taken along line BB. As illustrated in FIG. 3A and FIG. 3B, removing a part of the organic layer 34 located in an entirety of the bonding region 13 by using a mask to form an opening 39 having the same shape as the bonding region 13, and then directly etching the gate insulation layer 32 and the passivation layer 33 to expose the wire 31, so that the wire 31 can be directly connected with the conductive layer 35. Although the above process omits one masking process, the organic layer 34 has a large slope angle at an edge of the opening 39 as formed, which may easily cause a conductive material of the conductive layer to be remained at the edge of the opening 39 during a patterning process due to insufficient exposure, and hence cause a short circuit problem.

Figure 4:
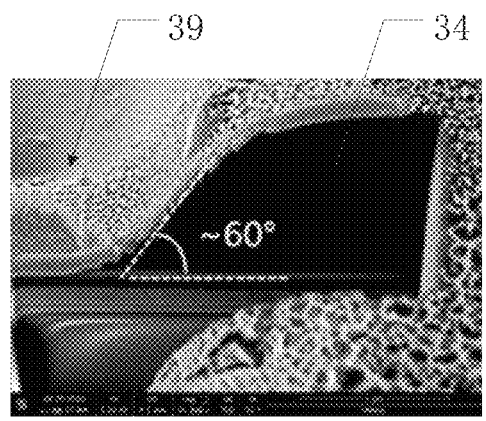
FIG. 4 is a focused ion beam (FIB) diagram of an organic layer at an edge of an opening thereof.
Figure 5A:
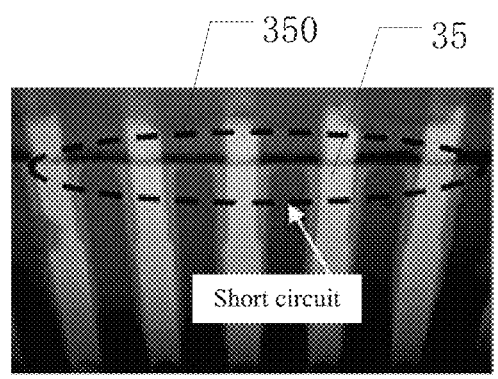
FIG. 5A is a microscope image of a short circuit in a bonding region of an array substrate.
Figure 5B:
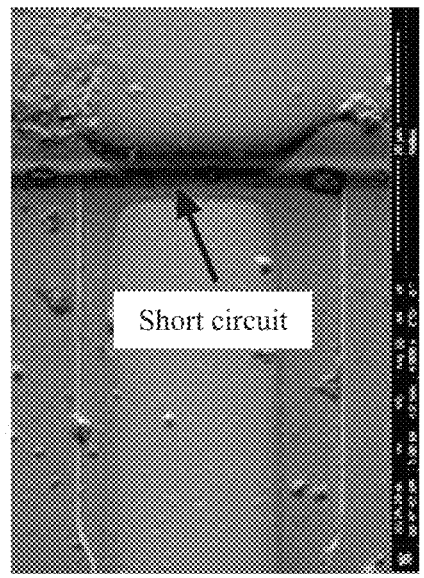
FIG. 5B is a scanning electron microscope image of a short circuit in a bonding region of an array substrate.

FIG. 4 is a focused ion beam (FIB) diagram of an organic layer at an edge of an opening thereof. As illustrated in FIG. 4, because a thickness of the organic layer 34 is large, a slope angle of the organic layer 34 at an edge of an opening in the organic layer 34 is large. For example, the slope angle at the edge is 60 degrees. Generally, forming a conductive layer on the organic layer includes: forming a conductive material layer to cover the organic layer and the opening of the organic layer; coating a photoresist on the conductive material layer; exposing the photoresist with a mask to form a photoresist pattern; and etching the conductive material layer by using the photoresist pattern as a mask to form a conductive layer. Due to the large slope angle at the edge of the opening, when performing an exposure process on the photoresist, an exposure amount to the photoresist at the edge of the opening is less than an exposure amount to the photoresist in the middle of the opening, thereby forming a photoresist residue at the edge of the opening; subsequently, in the process of etching the conductive material layer by using the photoresist pattern, a residue of the conductive material layer is also likely to be formed at the edge of the opening, which electrically connects different wires and causes a short circuit. FIG. 5A is a microscope image of a short circuit in a bonding region of an array substrate; FIG. 5B is a scanning electron microscope image of a short circuit in a bonding region of an array substrate. As illustrated in FIG. 5A and FIG. 5B, the conductive material used to form the conductive layer 35 forms a residue 350 at the edge of the opening, thereby electrically connecting different wires to cause a short circuit.

In this regard, the embodiments of the present disclosure provide an array substrate, a manufacturing method thereof, a display device, and a mask. The array substrate includes: a base substrate including a display region and a peripheral region located at a periphery of the display region; a first conductive layer located on the base substrate; and an organic layer located at a side of the first conductive layer away from the base substrate. The peripheral region includes at least one bonding region, in each bonding region, the first conductive layer includes a plurality of wires arranged at intervals, the organic layer includes a first opening, the first opening exposes the plurality of wires, and the first opening includes an edge which is intersected with an extension direction of each of the plurality of wires, the organic layer further includes a zigzag-shaped groove connected with the edge. In a direction perpendicular to the base substrate, a depth of the zigzag-shaped groove is less than a thickness of the organic layer. An orthographic projection of the zigzag-shaped groove on a plane parallel with the base substrate is zigzag-shaped. Therefore, in the array substrate, by providing the zigzag-shaped groove, a slope angle at an edge of the first opening is reduced, and a residue of the photoresist for patterning the subsequent conductive layer is avoided to be formed at the edge of the first opening, thereby avoiding a short circuit in the bonding region, and further improving the product yield and product quality of the array substrate.

Hereinafter, the array substrate, the manufacturing method thereof, the display device and the mask provided by the embodiments of the present disclosure will be described in detail with reference to the drawings.

Figure 6A:
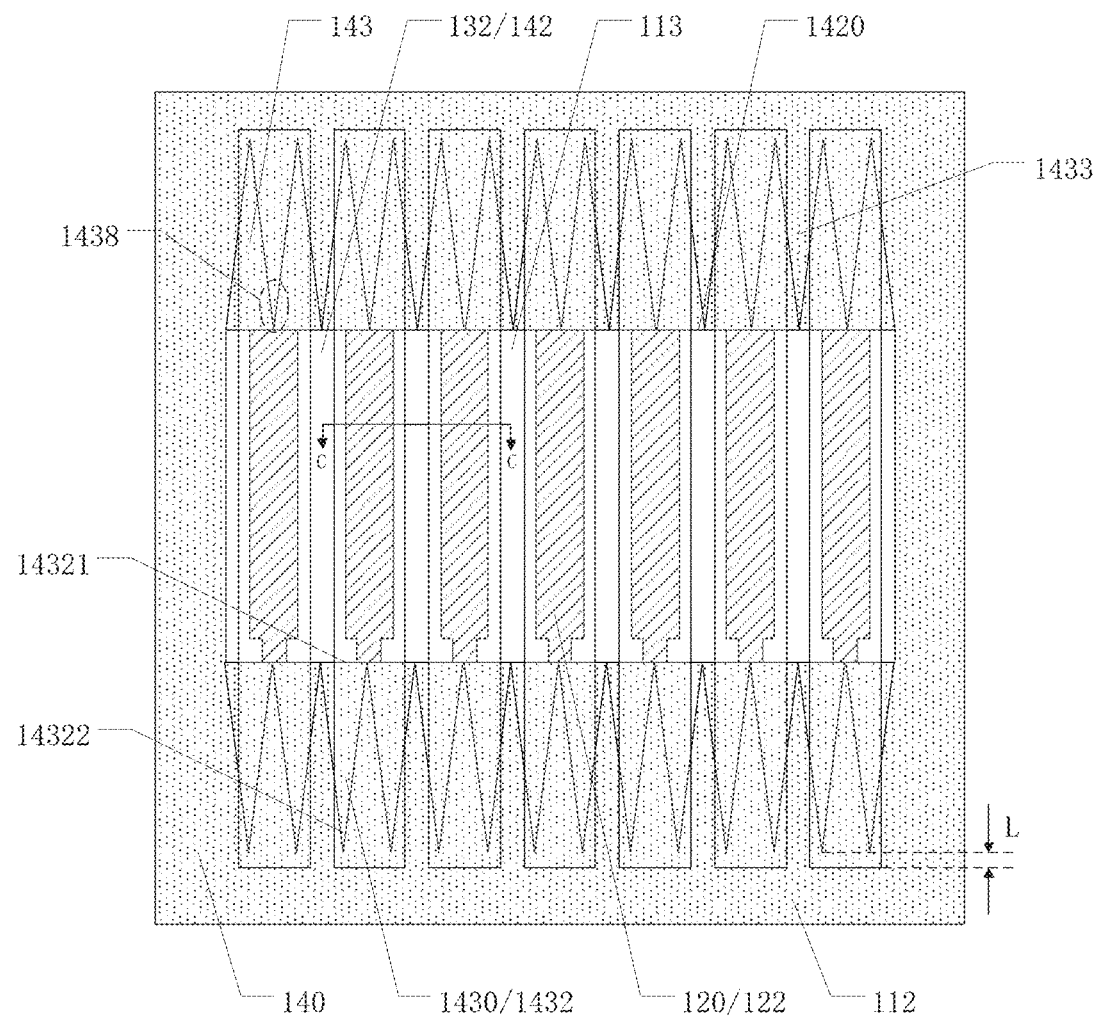
FIG. 6A is a schematic plan view of an array substrate provided by an embodiment of the present disclosure.
Figure 6B:
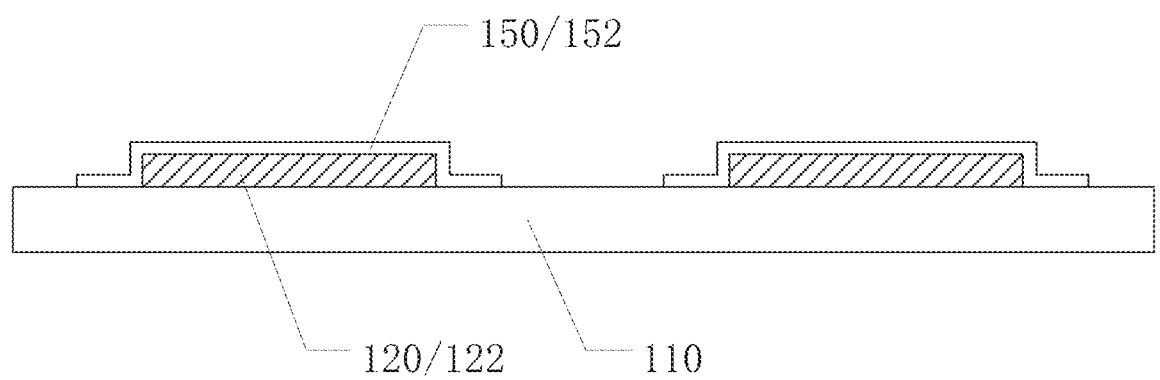
FIG. 6B is a schematic cross-sectional view of the array substrate illustrated in FIG. 6A taken along line CC.

An embodiment of the present disclosure provides an array substrate. FIG. 6A is a schematic plan view of an array substrate provided by an embodiment of the present disclosure; FIG. 6B is a schematic cross-sectional view of the array substrate illustrated in FIG. 6A taken along line CC. As illustrated in FIG. 6A and FIG. 6B, the array substrate 100 includes a base substrate 110, a first conductive layer 120, and an organic layer 140. The base substrate 110 includes a display region and a peripheral region 112 located at a periphery of the display region; the first conductive layer 120 is located on the base substrate 110; and the organic layer 140 is located at a side of the first conductive layer 120 away from the base substrate 110. The peripheral region 112 includes at least one bonding region 113, and the specific number of the bonding region 113 may be determined according to parameters such as the size, type, and resolution of the array substrate. In each bonding region 113, the first conductive layer 120 includes a plurality of wires 122 arranged at intervals, the organic layer 140 includes a first opening 142, the first opening 142 exposes the plurality of wires 122, and the first opening 142 includes an edge 1420 that is intersected with an extension direction of the wire 122, the organic layer 140 further includes a zigzag-shaped groove 143 connected with the edge 1420. In a direction perpendicular to the base substrate 110, a depth of the zigzag-shaped groove 143 is less than a thickness of the organic layer 140. An orthographic projection of the groove 143 on a plane parallel with the base substrate 110 is zigzag-shaped. It should be explained that the above-mentioned wire is used to electrically connect the signal line (for example, a gate line, a data line, etc.) in the display region of the array substrate with an external drive circuit; and "a depth of the zigzag-shaped groove is less than a thickness of the organic layer" refers to that the zigzag-shaped groove does not penetrate the organic layer.

In the array substrate provided by the embodiment of the present disclosure, the organic layer further includes a zigzag-shaped groove connected with the edge, a depth of the zigzag-shaped groove is less than a thickness of the organic layer. The zigzag-shaped groove can effectively reduce a slope angle at an edge of the first opening to avoid a formation of photoresist residue at the edge of the first opening, and avoid a residue to be formed at the edge of the first opening during forming a second conductive layer (e.g., indium tin oxide (ITO) layer) in a subsequent process, thereby avoiding electrical connection of different wires resulted by the residue of the second conductive layer. Thus, the array substrate can avoid the occurrence of a short-circuit phenomenon in the bonding region, thereby improving the product yield and product quality of the array substrate.

For example, in some exemplary embodiments, the slope angle at the position of the edge 1420 of the first opening 142 is less than 30 degrees, which can effectively avoid a formation of a photoresist residue at the edge of the first opening during the exposure process, and can avoid a formation of a residue at the edge of the first opening during forming a second conductive layer (for example, an indium tin oxide (ITO) layer) in a subsequent process, so as to avoid an electrical connection of different wires resulted by the residue of the second conductive layer. For example, the wire 122 may be formed from a conductive layer as same as a gate electrode or a gate line. In other words, in the display region 111, the first conductive layer 120 may include a gate electrode and a gate line. Of course, the embodiments of the present disclosure include but are not limited thereto, and the wire 122 may also be formed from the same conductive layer as the data line or other signal lines.

For example, in some exemplary embodiments, the zigzag-shaped groove 143 includes a plurality of zigzag portions 1430 arranged along the edge 1420, and a distance between respective parts of any two adjacent zigzag portions 1430 at a side close to the edge 1420 (for example, as illustrated by a dotted frame 1438 in FIG. 6A) is less than a resolution of an exposure machine. Therefore, when using an exposure process to form the above-mentioned zigzag-shaped groove (the organic layer can be made of a photoresist material), a part of a mask corresponding to the respective parts of the two adjacent zigzag portions at the side close to the edge (for example, such as the part of the pattern corresponding to the parts indicated by the dashed frame 1438 in FIG. 6A) diffracts light to achieve a diffraction compensation exposure to the edge of the first opening. Thus, on the one hand, the above-mentioned zigzag-shaped groove can be formed, and in the direction perpendicular to the base substrate, a depth of the zigzag-shaped groove is smaller than a thickness of the organic layer; on the other hand, an exposure amount at the edge of the first opening can be increased by the above-mentioned diffraction compensation exposure, thereby reducing the slope angle at the edge of the first opening.

For example, in some exemplary embodiments, the array substrate further includes: an insulation layer located between the first conductive layer 120 and the organic layer 140, the insulation layer includes a second opening 132, and both the second opening 132 and the first opening 142 expose the plurality of wires 122. The insulation layer is located at a side of the first conductive layer 120 away from the base substrate 110 (that is, located below the organic layer 140). It should be explained that, because the insulation layer is covered by the organic layer and a part of the insulation layer in the bonding region is removed, the insulation layer is not illustrated in FIG. 6A and FIG. 6B. The position of the insulation layer may be referred to the position of the insulation layer in FIG. 2B.

For example, in some exemplary embodiments, the insulation layer may include a gate insulation layer and a passivation layer.

For example, in some exemplary embodiments, a material of the organic layer includes a photoresist, so that the organic layer can be patterned only through exposure and development processes without using an etching process, which can simplify the process and reduce cost. In the case where the organic layer is made of a photoresist material, after the first opening is formed in the organic layer, the organic layer with the first opening can be used as a mask to etch a part of the insulation layer below the organic layer, for example, a wet etching process is used to form a second opening in the insulation layer having the same shape as the first opening, so that one masking process can be omitted.

For example, in some exemplary embodiments, as illustrated in FIG. 6A and FIG. 6B, the array substrate 100 further includes: a second conductive layer 150 located at a side of the organic layer 140 away from the first conductive layer 120, in each bonding region 113, the second conductive layer 150 includes a plurality of electrode strips 152 arranged at intervals. The plurality of electrode strips 152 are electrically connected with the plurality of wires 122, respectively, through both the second opening 132 and the first opening 142. Thus, an electrical connection between the plurality of wires and an external circuit can be achieved by connecting the plurality of electrode strips with the external circuit. For example, the external circuit may be a driving circuit.

For example, in some exemplary embodiments, a material of the first conductive layer 120 includes a metal, and a material of the second conductive layer 150 includes a transparent metal oxide such as indium tin oxide (ITO).

For example, in some exemplary embodiments, as illustrated in FIG. 6A and FIG. 6B, the electrode strip 152 covers the wire 122 and at least part of the zigzag-shaped groove 143, and extends beyond an end of the zigzag-shaped groove 143 away from the first opening 142 in the extension direction of the wire 122. Thus, because the electrode strip 152 covers the wire 122 and at least part of the zigzag-shaped groove 143, the electrode strip 152 can completely cover the wire 122 in the first opening 142, thereby protecting the wire 122 by preventing water and oxygen from entering and corroding the wire 122. In addition, in the manufacturing process of the array substrate, after the second conductive layer is formed, one or more baking process is performed. The organic layer is prone to expand with heat and contract with cold, resulting in poor contact between the electrode strip and the organic layer, which causes water and oxygen to immerse the wire and to corrode the wire; in this case, in the extension direction of each of the plurality of wires, the electrode strip extends beyond an end of the zigzag-shaped groove away from the first opening, so that when the organic layer contracts, a good contact between the electrode strip and the organic layer can still be guaranteed, which can further prevent water and oxygen from immersing the wire and corroding the wire. It should be explained that, in this exemplary embodiment, the electrode strip is merely defined to cover the first opening and the zigzag-shaped groove in the extension direction of each of the plurality of wires but is not defined to also cover the first opening and the zigzag-shaped groove in a direction perpendicular to the extension direction of the wire. Of course, as illustrated in FIG. 6A and FIG. 6B, in order to protect the wire, the electrode strip also covers the wire in a direction perpendicular to the extension direction of the wire.

For example, in some exemplary embodiments, as illustrated in FIG. 6A and FIG. 6B, in the extension direction of the wire 122, a length L of the electrode strip 152 extending beyond an end of the zigzag-shaped groove 143 away from the first opening 142 is greater than 10 microns.

For example, in some exemplary embodiments, as illustrated in FIG. 6A and FIG. 6B, the edge 1420 is perpendicular to the extension direction of the wire 122. Of course, the embodiments of the present disclosure include but are not limited thereto, and the edge 1420 may also form an acute angle or an obtuse angle with respect to the wire 122.

For example, as illustrated in FIG. 6A and FIG. 6B, the shapes of the second opening 132 and the first opening 142 are both rectangles. In this case, the first opening 142 includes two edges 1420 that are intersected with the extension direction of the wire 122, and therefore, the organic layer 140 further includes two zigzag-shaped groove 143 connected with the two edges 1420, respectively. Of course, the embodiments of the present disclosure include but are not limited thereto, the organic layer 140 may also only provide the zigzag-shaped groove 143 at one of the two edges 1420, and the other one of the two edges 1420 is not provided with a zigzag-shaped groove 143.

For example, as illustrated in FIG. 6A and FIG. 6B, an orthographic projection of the second opening 132 on the base substrate 110 coincides with an orthographic projection of the first opening 142 on the base substrate 110. That is, the second opening and the first opening have the same shape and the same position. It should be explained that, in the etching process, because the flow of the etching liquid will result in a certain error, the above-mentioned "coincide" also includes the situation of "substantially coincide".

For example, as illustrated in FIG. 6A and FIG. 6B, the zigzag-shaped groove 143 includes a plurality of triangular grooves 1432 arranged side by side in sequence, each triangular groove 1432 includes a bottom side 14321 and a vertex angle 14322 opposite to the bottom side 14321, and the bottom side 14321 is overlapped with the edge 1420, the vertex angle 14322 is located at a side of the bottom side 14321 away from the first opening 142.

For example, as illustrated in FIG. 6A and FIG. 6B, a height of the triangular groove 1432 in the extension direction of the wire 122 is greater than or equal to 50 microns. It should be explained that the above "height" refers to a size of an orthographic projection of the triangular groove on the base substrate in the extension direction of the wire.

For example, as illustrated in FIG. 6A and FIG. 6B, a width of each wire 122 is D1, a distance between two adjacent wires 122 is D2, and a length of the bottom side 14321 of the triangular groove 1432 is (D1+D2)/2. Of course, the embodiments of the present disclosure include but are not limited thereto, the length of the bottom side of the triangular groove can be adjusted according to the pattern size and the process capability, and can be less than or greater than (D1+D2)/2.

For example, as illustrated in FIG. 6A and FIG. 6B, the organic layer 140 includes a triangular region 1433 located between two adjacent triangular grooves 1432, and the triangular region 1433 is provided between the two adjacent wires 122. Thus, the triangular region 1433 can isolate the two adjacent wires 122, thereby further avoiding the occurrence of a short circuit in the bonding region.

For example, in some exemplary embodiments, in a direction from the bottom side 14321 of the triangular groove 1432 to the vertex angle 14322 of the triangular groove 1432, as the exposure amount decreases, the depth of each triangular groove 1432 in the direction perpendicular to the base substrate 110 gradually decreases.

It should be explained that, the embodiments of the present disclosure include the case illustrated in FIG. 6A and FIG. 6B where a shape of the triangular groove 1432 is an isosceles triangle, without limited thereto, and the shape of the triangular groove may also not be an isosceles triangle.

Figure 7A:
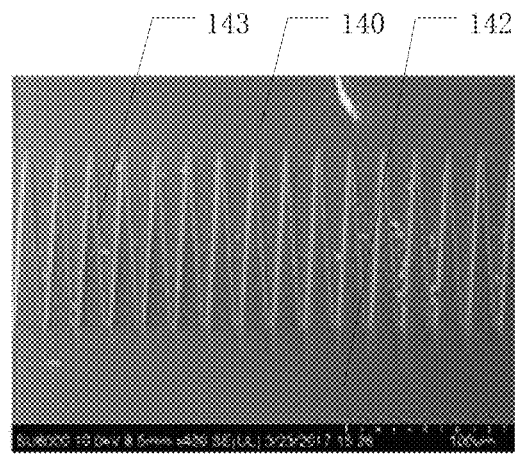
FIG. 7A is a planer scanning electron microscope image of an organic layer in an array substrate provided by an embodiment of the present disclosure.
Figure 7B:
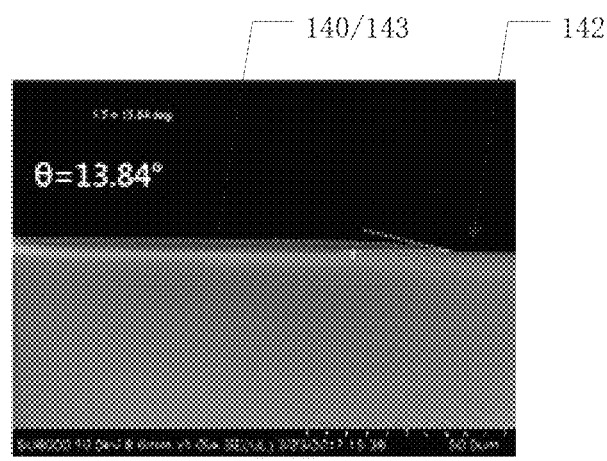
FIG. 7B is a cross-sectional scanning electron microscope image of an organic layer in an array substrate provided by an embodiment of the present disclosure.

FIG. 7A is a planar scanning electron microscope image of an organic layer in an array substrate provided by an embodiment of the present disclosure; FIG. 7B is a cross-sectional scanning electron microscope image of the organic layer in the array substrate provided by an embodiment of the present disclosure. As illustrated in FIG. 7A, the organic layer 140 is provided with a zigzag-shaped groove 143; as illustrated in FIG. 7B, upon measuring, the slope angle at the edge of the first opening 142 drops to 13.84 degrees. It should be explained that, although a slope angle at a portion of the edge of the first opening corresponding to the triangular groove and a slope angle at a portion of the edge of the first opening corresponding to the triangular region are not the same, the triangular grooves are arranged side by side and have triangular-shaped orthographic projections on the base substrate so that the exposure amount is changed gradually along the edge of the first opening. Therefore, the slope angle at the edge of the first opening that is finally formed is also continuously changed, thereby better avoiding a residue of the photoresist used to pattern the second conductive layer.

Figure 8:
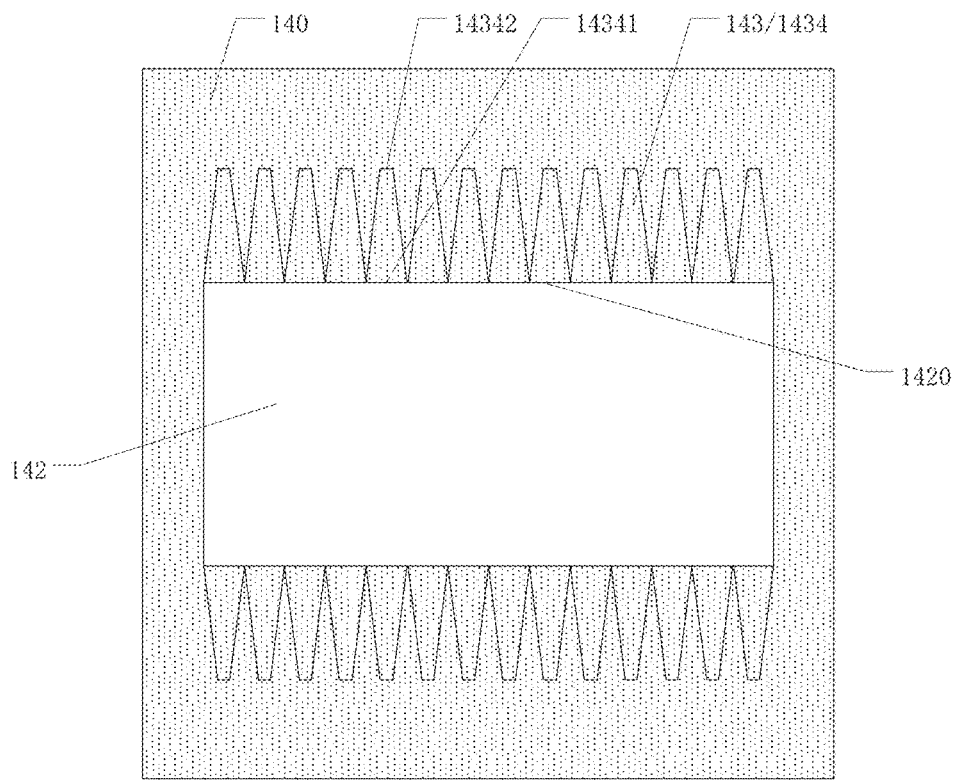
FIG. 8 is a schematic plan view of an organic layer in an array substrate provided by an embodiment of the present disclosure.

FIG. 8 is a schematic plan view of an organic layer in an array substrate provided by an embodiment of the present disclosure. As illustrated in FIG. 8, the zigzag-shaped groove 143 includes a plurality of trapezoidal grooves 1434 arranged side by side in sequence, each trapezoidal groove 1434 includes a long base 14341 and a short base 14342 opposite to the long base 14341, and the long base 14341 is overlapped with the edge 1420, the short base 14342 is located at a side of the long base 14341 away from the first opening 142.

For example, in some exemplary embodiments, as illustrated in FIG. 8, a length of the long base 14341 is greater than a resolution of an exposure machine, and a length of the short base 14342 is less than the resolution of the exposure machine.

It is worth noting that a zigzag portion of the above-mentioned zigzag-shaped groove may also have a stepped shape, that is, the zigzag portion has a shape formed by a plurality of superposed rectangles with gradually decreased widths.

Figure 9:
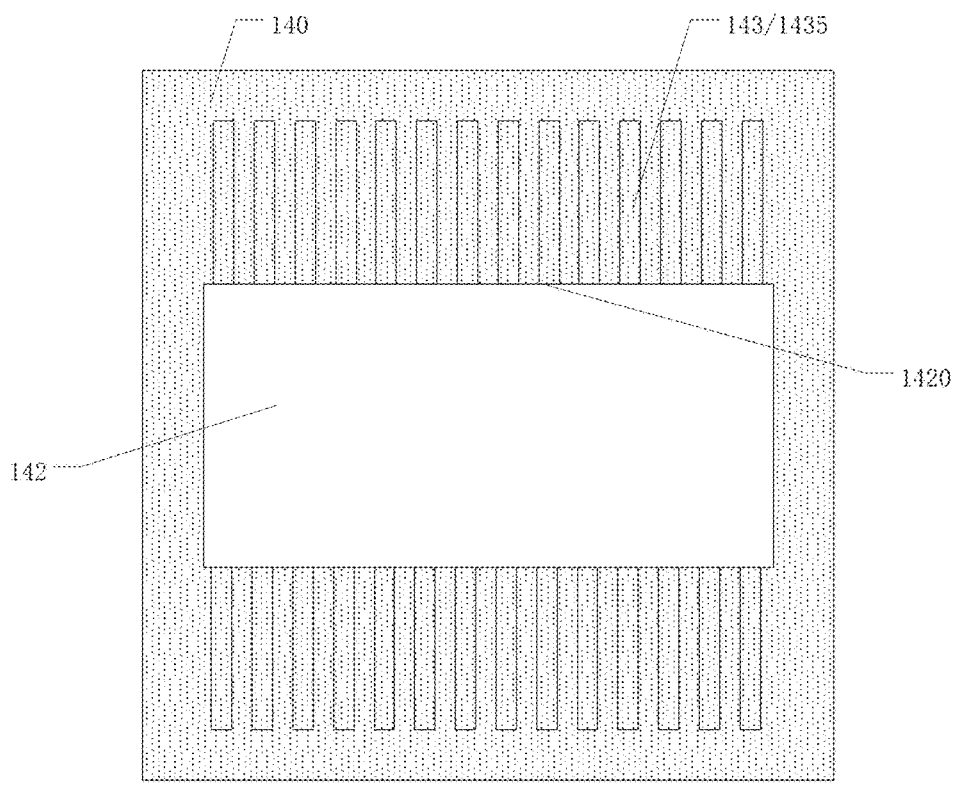
FIG. 9 is a schematic plan view of an organic layer in an array substrate provided by an embodiment of the present disclosure.

FIG. 9 is a schematic plan view of an organic layer in an array substrate provided by an embodiment of the present disclosure. As illustrated in FIG. 9, the zigzag-shaped groove 143 includes a plurality of rectangular grooves 1435 arranged at intervals, one side of each rectangular groove 1435 is overlapped with the edge 1420, and a width of the interval between adjacent rectangular grooves 1435 in a direction perpendicular to the extension direction of the wire 122 is smaller than a resolution of an exposure machine. Therefore, when the above-mentioned zigzag-shaped groove is formed by an exposure process (the organic layer can be made of a photoresist material), a part of the pattern of a mask corresponding to the interval between the adjacent rectangular grooves can be used to diffract light, so that a diffraction compensation exposure is realized at the edge of the first opening. Thus, on the one hand, the above-mentioned zigzag-shaped groove can be formed, and a depth of the zigzag-shaped groove in the direction perpendicular to the base substrate is smaller than a thickness of the organic layer; on the other hand, an exposure amount at the edge of the first opening is increased by the above-mentioned diffraction compensation exposure, thereby reducing a slope angle at the edge of the first opening.

Figure 10:
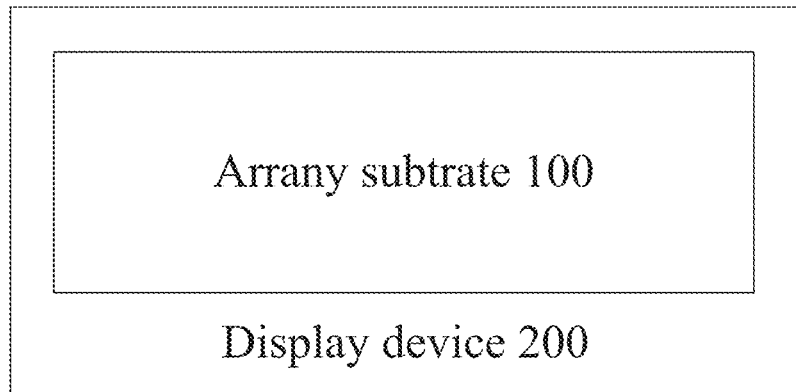
FIG. 10 illustrates a display device provided by an embodiment of the present disclosure.

At least one embodiment of the present disclosure further provides a display device. FIG. 10 is a display device provided by an embodiment of the present disclosure. As illustrated in FIG. 10, the display device 200 includes an array substrate 100, and the array substrate 100 may be any array substrate in the foregoing embodiments. Therefore, the display device also has the same or similar beneficial effects as the array substrate included in the display device. For details, reference may be made to the specific description in the foregoing embodiments without repeated in the embodiments of the present disclosure.

For example, in some exemplary embodiments, the display device may be any product or component with a display function, such as a smartphone, a tablet computer, a television, a display, a notebook computer, a digital photo frame, and a navigator.

For example, in some exemplary embodiments, the display device may be a curved display device. In the case where the display device is applied to a curved display device, the display device has a high aperture ratio, and the light leakage phenomenon is not easily occurred therein.

Figure 11:
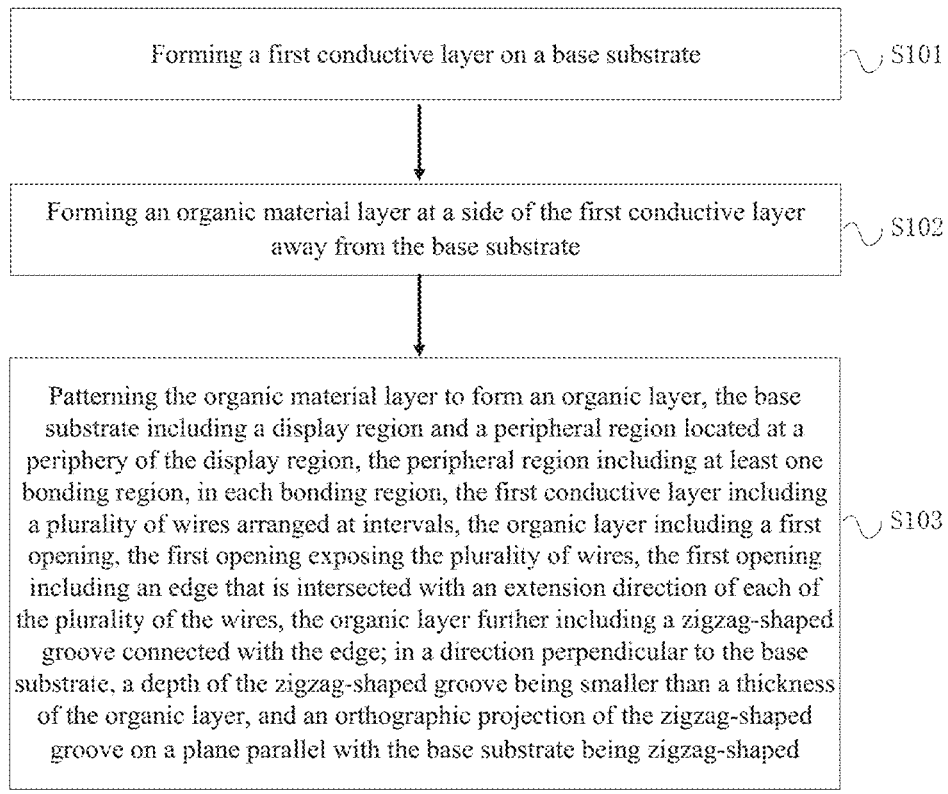
FIG. 11 illustrates a manufacturing method of an array substrate provided by an embodiment of the present disclosure.

At least one embodiment of the present disclosure further provides a manufacturing method of an array substrate. FIG. 11 illustrates a manufacturing method of an array substrate provided by an embodiment of the present disclosure. As illustrated in FIG. 11, the manufacturing method of the array substrate includes the following steps.

S101: Forming a first conductive layer on a base substrate.

For example, the base substrate may be a transparent substrate such as a glass substrate, a quartz substrate, a plastic substrate, etc.; the first conductive layer may be a gate metal layer, that is, in a display region of the array substrate, the first conductive layer may include a gate line and a gate electrode. Of course, the embodiments of the present disclosure include but are not limited thereto, the base substrate may also adopt other substrates, and the first conductive layer may also be other conductive layers.

S102: Forming an organic material layer at a side of the first conductive layer away from the base substrate.

For example, a coating process may be used to coat the organic material layer at the side of the first conductive layer away from the base substrate. The organic material layer can be used to flatten the step difference of the film layer below the organic material layer, so as to improve the flatness of the array substrate.

S103: Patterning the organic material layer to form an organic layer. The base substrate includes a display region and a peripheral region located at a periphery of the display region. The peripheral region includes at least one bonding region. In each bonding region, the first conductive layer includes a plurality of wires arranged at intervals. The organic layer includes a first opening. The first opening exposes the plurality of wires. The first opening includes an edge that is intersected with an extension direction of each of the plurality of the wires. The organic layer further includes a zigzag-shaped groove connected with the edge. In a direction perpendicular to the base substrate, a depth of the zigzag-shaped groove is smaller than a thickness of the organic layer, and an orthographic projection of the zigzag-shaped groove on a plane parallel with the base substrate is zigzag-shaped.

In the manufacturing method of the array substrate provided by an embodiment of the present disclosure, the organic layer further includes a zigzag-shaped groove connected with the edge. The zigzag-shaped groove can reduce a slope angle at an edge of the first opening, can avoid a residual of photoresist to be formed at the edge of the first opening, and can prevent a residue from being formed at the edge of the first opening during forming a second conductive layer (for example, an indium tin oxide (ITO) layer) in a subsequent process, thereby avoiding electrical connection of different wires resulted by the residual of the second conductive layer. Thus, the array substrate can avoid the occurrence of short circuit in the bonding region.

For example, when the organic material layer is patterned to form an organic layer, a portion of the mask as used corresponding to the first opening can completely block light, and a part of the organic material layer below this portion of the mask can be completely removed in a subsequent development process, thereby forming the first opening; and in a portion of the mask as used corresponding to the zigzag-shaped groove, a distance between bottom portions of two adjacent triangular portions is less than the resolution of the exposure machine, so that a diffraction phenomenon is occurred, which results in that a part of the organic layer blocked by the two triangular portions is partially exposed and thus is partially removed in the subsequent development process, thereby forming a zigzag-shaped groove in the organic layer. In this case, on the one hand, the zigzag-shaped groove reduces a height of the organic layer at the edge of the first opening, so that the slope angle of the organic layer at the edge of the first opening can be reduced; on the other hand, the diffraction phenomenon occurred at the interval between the bottom portions of two adjacent triangular portions will also perform exposure compensation at the edge of the first opening, further reducing the slope angle at the edge of the first opening.

For example, in some exemplary embodiments, before forming the organic material layer, the manufacturing method further includes: forming an insulation material layer at a side of the first conductive layer away from the base substrate. In this case, patterning the organic material layer to form the organic layer includes: patterning the insulation material layer and the organic material layer by using a single masking process to form the insulation layer and the organic layer; the insulation layer includes a second opening, both the first opening and the second opening expose the plurality of wires.

For example, the insulation material layer can be used to form a gate insulation layer, a passivation layer, and the like.

For example, a material of the insulation material layer and a material of the passivation layer may be silicon nitride, silicon oxide, or silicon oxynitride.

For example, in some exemplary embodiments, the manufacturing method of the array substrate further includes: forming a second conductive layer at a side of the organic layer away from the first conductive layer; in each bonding region, the second conductive layer includes a plurality of electrode strips arranged at intervals, and the plurality of electrode strips are electrically connected with the plurality of wires, respectively, through both the second opening and the first opening. Thus, an electrical connection between the plurality of wires and an external circuit can be achieved by connecting the plurality of electrode strips to the external circuit. For example, the external circuit may be a driving circuit.

For example, forming the second conductive layer at the side of the organic layer away from the first conductive layer may include: forming a second conductive material layer at the side of the organic layer away from the first conductive layer, for example, a conductive material layer, that is, the second conductive material layer, is formed at the side of the organic layer away from the first conductive layer by sputtering. In this case, the second conductive material will cover an unremoved portion of the organic layer, the first opening, and the zigzag-shaped groove. Forming the second conductive layer may further include: coating a photoresist at a side of the second conductive layer away from the organic layer; patterning the photoresist to form a photoresist pattern; and then etching the second conductive material layer by using the photoresist pattern as a mask. In this case, a slope angle at an edge of the first opening is small, the second conductive material layer is located at the edge of the first opening, and the part that needs to be removed can be fully etched away without forming a conductive residue, thereby avoiding a short circuit caused by electrical connection between different electrode strips.

For example, in some exemplary embodiments, a material of the first conductive layer includes a metal, and a material of the second conductive layer includes a transparent metal oxide such as indium tin oxide (ITO).

For example, in some exemplary embodiments, patterning the insulation material layer and the organic material layer by using a single masking process to form the insulation layer and the organic layer includes: exposing and developing the organic material layer by using a mask to form, in the organic layer, a first opening and a zigzag-shaped groove that are located in a bonding region; and etching the insulation material layer by using the organic layer including the first opening as a mask to form, in the insulation layer, a second opening located in the bonding region. Therefore, the manufacturing method of the array substrate can form the second opening and the first opening by only one masking process using the same mask, thereby simplifying the processes and reducing the manufacturing cost. It should be explained that the above-mentioned mask may further include a pattern corresponding to a via hole in the display region, so that the via hole in the organic layer and in the insulation layer may be formed in the display region at the same time when forming the second opening and the first opening. Moreover, because the second opening and the via hole in the insulation layer in the display region are formed by etching with the organic layer as a mask, the problem of poor accuracy in the alignment between the via hole in the insulating layer and the via hole in the organic layer will not be occurred in the display region.

For example, in some exemplary embodiments, before forming the organic material layer, the manufacturing method of the array substrate further includes: forming a color filter layer. The color filter layer may include color filters of multiple colors, in one-to-one correspondence with the sub-pixels formed on the array substrate, so that the array substrate can perform colored display. Therefore, the manufacturing method of the array substrate can reduce the difficulty in aligning the color filter with the sub-pixel, thereby reducing the manufacturing cost.

Figure 12:
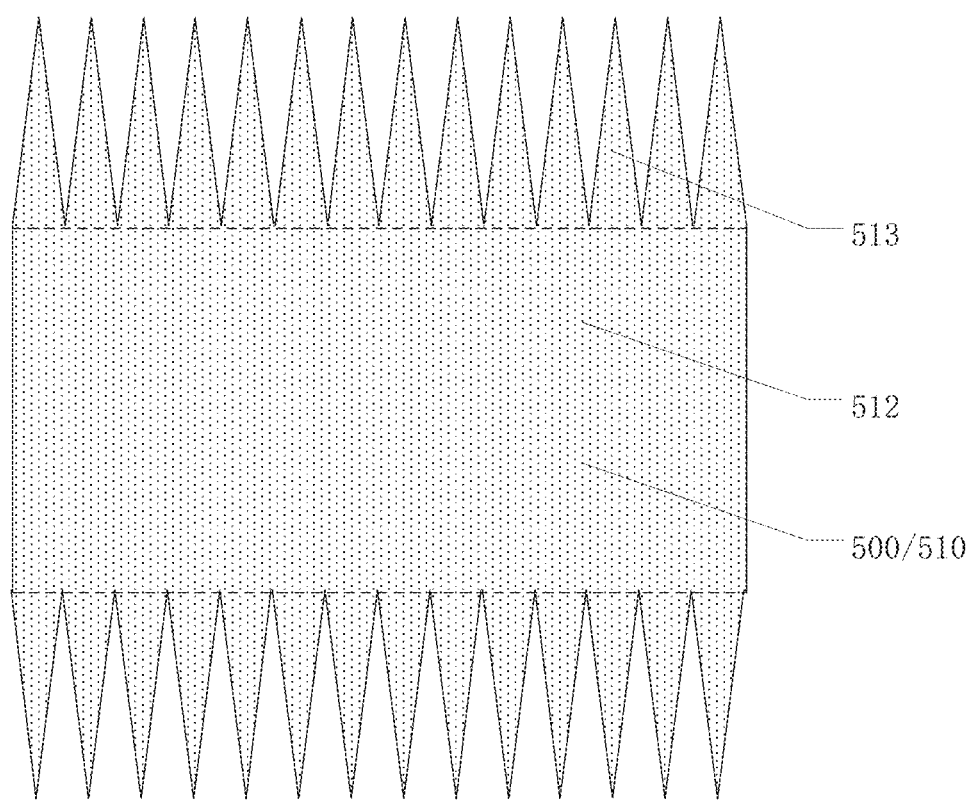
FIG. 12 is a schematic plan view of a mask provided by an embodiment of the present disclosure.

At least one embodiment of the present disclosure further provides a mask. FIG. 12 is a schematic plan view of a mask provided by an embodiment of the present disclosure. As illustrated in FIG. 12, the mask 500 includes a pattern portion 510, the pattern portion 510 includes a portion 512 corresponding to the first opening and a portion 513 corresponding to the zigzag-shaped groove. Thus, the mask can be used to form the first opening and the zigzag-shaped groove in the organic layer.

For example, in some exemplary embodiments, the zigzag-shaped groove includes a plurality of zigzag portions arranged along the edge; because a distance between respective parts of any two adjacent zigzag portions at a side close to the edge is smaller than a resolution of the exposure machine, a distance between parts of the pattern portion corresponding to the respective parts of the two adjacent zigzag portions at the side close to the edge of the mask is also smaller than the resolution of the exposure machine. When the above-mentioned mask is used to perform the exposure process to form the above-mentioned zigzag-shaped groove (the organic layer can be made of a photoresist material), a part of the pattern portion of the mask corresponding to the respective parts of the two adjacent zigzag portions at the side close to the edge can diffract light, so as to realize the diffraction compensation exposure to the edge of the first opening. Thus, on the one hand, a depth of the zigzag-shaped groove may be formed to be less than a thickness of the organic layer in a direction perpendicular to the base substrate; on the other hand, an exposure amount at the edge of the first opening is increased through the above-mentioned diffraction compensation exposure, thereby reducing a slope angle at the edge of the first opening.

For example, in some exemplary embodiments, a material of the organic layer includes a negative photoresist, and the pattern portion is an opaque portion. When the organic material layer is patterned by using the mask to form an organic layer, a portion of the mask corresponding to the first opening can completely block light, and a portion of the organic material layer below the portion of the mask can be completely removed in a subsequent development process so as to form the first opening; and in a portion of the mask corresponding to the zigzag-shaped groove, a distance between bottom portions of two adjacent triangular portions is less than a resolution of an exposure machine, so that a diffraction phenomenon is occurred, which results in that the organic layer blocked by the two triangular portions are partially exposed and hence are partially removed in the subsequent development process, thereby forming a zigzag-shaped groove in the organic layer. In this case, on the one hand, the zigzag-shaped groove reduces a height of a portion of the organic layer at the edge of the first opening, so that the slope angle at the edge of the first opening can be reduced; on the other hand, the diffraction phenomenon occurred at the interval between the bottom portions of two adjacent triangular portions will also perform an exposure compensation at the edge of the first opening, thereby further reducing the slope angle at the edge of the first opening.

For example, in some exemplary embodiments, a material of the organic layer includes a positive photoresist, and the pattern portion is a light-transmission portion. The process of using the mask to pattern the organic material layer to form the organic layer can be referred to the above description, and will not be repeated here.

The following statements need to be explained:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The above are merely particular embodiments of the present disclosure but are not limitative to the scope of the present disclosure; any of those skilled familiar with the related arts can easily conceive variations and substitutions in the technical scopes disclosed by the present disclosure, which should be encompassed in protection scopes of the present disclosure. Therefore, the scopes of the present disclosure should be defined in the appended claims.

What is claimed is:

1. An array substrate, comprising:
    a base substrate comprising a display region and a peripheral region located at a periphery of the display region;
    a first conductive layer located on the base substrate; and
    an organic layer located at a side of the first conductive layer away from the base substrate, wherein
    the peripheral region comprises at least one bonding region, and in each of the at least one bonding region, the first conductive layer comprises a plurality of wires arranged at intervals, and the organic layer comprises a first opening exposing the plurality of wires; and
    the first opening comprises an edge that is intersected with an extension direction of each of the plurality of wires; the organic layer further comprises a zigzag-shaped groove connected with the edge; in a direction perpendicular to the base substrate, a depth of the zigzag-shaped groove is smaller than a thickness of the organic layer; and an orthographic projection of the zigzag-shaped groove on a plane parallel with the base substrate is zigzag-shaped, wherein
    the zigzag-shaped groove comprises a plurality of triangular grooves arranged along the edge of the first opening, wherein each of the plurality of triangular grooves comprises a bottom side and a vertex angle opposite to the bottom side, the bottom side is overlapped with the edge of the first opening, and the vertex angle is located at a side of the bottom side away from the first opening, a width of each of the wires is D1, a distance between two adjacent wires is D2, and a length of the bottom side of the triangular groove is (D1+D2)/2, and the organic layer further comprises a plurality of interval regions located between adjacent triangular grooves, and neither orthographic projections of the plurality of triangular grooves nor orthographic projections of the plurality of interval regions on a first plane perpendicular to the base substrate and parallel to an extending direction of the wire are overlapped with orthographic projections of portions of the plurality of wires exposed through the first opening on the first plane.

2. The array substrate according to claim 1, further comprising:

an insulation layer located between the first conductive layer and the organic layer, wherein the insulation layer comprises a second opening, and both the second opening and the first opening expose the plurality of wires.

3. The array substrate according to claim 2, further comprising:

a second conductive layer located at a side of the organic layer away from the first conductive layer, wherein in each of the at least one bonding region, the second conductive layer comprises a plurality of electrode strips arranged at intervals, and the plurality of electrode strips are electrically connected with the plurality of wires, respectively, through both the second opening and the first opening.

4. The array substrate according to claim 3, wherein the plurality of electrode strips cover at least part of the zigzag-shaped groove, and extend beyond an end of the zigzag-shaped groove which is away from the first opening in the extension direction of the wire.

5. The array substrate according to claim 4, wherein, in the extension direction of the wire, a length of each of the plurality of electrode strips extending beyond the end of the zigzag-shaped groove which is away from the first opening is greater than 10 microns.

6. The array substrate according to claim 1, wherein the edge is perpendicular to the extension direction of the wire.

7. The array substrate according to claim 1, wherein the plurality of interval regions comprise triangular regions located between adjacent triangular grooves, and the triangular region is provided between two adjacent wires.

8. The array substrate according to claim 1, wherein in a direction from the bottom side of the triangular groove to the vertex angle of the triangular groove, a depth of each of the plurality of triangular grooves gradually decreases in a direction perpendicular to the base substrate.

9. A mask for manufacturing the array substrate according to claim 1, wherein the mask comprises a pattern portion, wherein the pattern portion comprises a portion corresponding to the first opening and a portion corresponding to the zigzag-shaped groove.

10. The mask according to claim 9, wherein a material of the organic layer comprises a negative photoresist, and the pattern portion is an opaque portion.

11. The mask according to claim 9, wherein a material of the organic layer comprises a positive photoresist, and the pattern portion is a light-transmission portion.

12. A display device, comprising an array substrate, the array substrate comprising:

a base substrate comprising a display region and a peripheral region located at a periphery of the display region;

a first conductive layer located on the base substrate; and an organic layer located at a side of the first conductive layer away from the base substrate, wherein the peripheral region comprises at least one bonding region, and in each of the at least one bonding region, the first conductive layer comprises a plurality of wires arranged at intervals, and the organic layer comprises a first opening exposing the plurality of wires; and the first opening comprises an edge that is intersected with an extension direction of each of the plurality of wires; the organic layer further comprises a zigzag-shaped groove connected with the edge; in a direction perpendicular to the base substrate, a depth of the zigzag-shaped groove is smaller than a thickness of the organic layer; and an orthographic projection of the zigzag-shaped groove on a plane parallel with the base substrate is zigzag-shaped, wherein the zigzag-shaped groove comprises a plurality of triangular grooves arranged along the edge of the first opening, wherein each of the plurality of triangular grooves comprises a bottom side and a vertex angle opposite to the bottom side, the bottom side is overlapped with the edge of the first opening, and the vertex angle is located at a side of the bottom side away from the first opening, a width of each of the wires is D1, a distance between two adjacent wires is D2, and a length of the bottom side of the triangular groove is (D1+D2)/2, and the organic layer further comprises a plurality of interval regions located between adjacent triangular grooves, and neither orthographic projections of the plurality of triangular grooves nor orthographic projections of the plurality of interval regions on a first plane perpendicular to the base substrate and parallel to an extending direction of the wire are overlapped with orthographic projections of portions of the plurality of wires exposed through the first opening on the first plane.

13. A manufacturing method of an array substrate, comprising:

forming a first conductive layer on a base substrate;

forming an organic material layer at a side of the first conductive layer away from the base substrate; and patterning the organic material layer to form an organic layer, wherein the base substrate comprises a display region and a peripheral region located at a periphery of the display region, the peripheral region comprises at least one bonding region, and in each of the at least one bonding region, the first conductive layer comprises a plurality of wires arranged at intervals, the organic layer comprises a first opening, the first opening exposes the plurality of wires, and the first opening comprises an edge that is intersected with an extension direction of each of the plurality of the wires, and the organic layer further comprises a zigzag-shaped groove connected with the edge; in a direction perpendicular to the base substrate, a depth of the zigzag-shaped groove is smaller than a thickness of the organic layer, and an orthographic projection of the zigzag-shaped groove on a plane parallel with the base substrate is zigzag-shaped, wherein the zigzag-shaped groove comprises a plurality of triangular grooves arranged along the edge of the first opening, wherein each of the plurality of triangular grooves comprises a bottom side and a vertex angle opposite to the bottom side, the bottom side is overlapped with the edge of the first opening, and the vertex angle is located at a side of the bottom side away from the first opening, a width of each of the wires is D1, a distance between two adjacent wires is D2, and a length of the bottom side of the triangular groove is (D1+D2)/2, and the organic layer further comprises a plurality of interval regions located between adjacent triangular grooves, and neither orthographic projections of the plurality of triangular grooves nor orthographic projections of the plurality of interval regions on a first plane perpendicular to the base substrate and parallel to an extending direction of the wire are overlapped with orthographic projections of portions of the plurality of wires exposed through the first opening on the first plane.

14. The manufacturing method of the array substrate according to claim 13, further comprising:

before forming the organic material layer, forming an insulation material layer at a side of the first conductive layer away from the base substrate, wherein patterning the organic material layer to form an organic layer comprises: patterning the insulation material layer and the organic material layer by using a single masking process to form an insulation layer and the organic layer, the insulation layer comprises a second opening, both the first opening and the second opening expose the plurality of wires.

15. The manufacturing method of the array substrate according to claim 14, further comprising:

forming a second conductive layer at a side of the organic layer away from the first conductive layer, wherein in each of the at least one bonding region, the second conductive layer comprises a plurality of electrode strips arranged at intervals, and the plurality of electrode strips are electrically connected with the plurality of wires, respectively, through both the second opening and the first opening.

16. The manufacturing method of the array substrate according to claim 14, wherein patterning the insulation material layer and the organic material layer by using a single masking process to form an insulation layer and the organic layer comprises:

exposing and developing the organic material layer by using a mask to form, in the organic layer, the first opening and the zigzag-shaped groove located in the bonding region; and etching the insulation material layer by using the organic layer including the first opening as an etching mask to form, in the insulation layer, the second opening located in the bonding region.

* * * * *